United States Patent
Nakada

(10) Patent No.: US 6,605,964 B2
(45) Date of Patent: Aug. 12, 2003

(54) COMPARATOR CIRCUIT

(75) Inventor: Akira Nakada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/062,310

(22) Filed: Feb. 1, 2002

(65) Prior Publication Data

US 2002/0109532 A1 Aug. 15, 2002

(30) Foreign Application Priority Data

Feb. 5, 2001 (JP) .......................... 2001-028648

(51) Int. Cl.⁷ ................................ H03K 5/52
(52) U.S. Cl. .......................... 327/65; 327/62
(58) Field of Search .................. 327/50, 63, 71, 327/72, 75, 62, 65, 74

(56) References Cited

U.S. PATENT DOCUMENTS 5,446,396 A * 8/1995 Brehmer ............... 327/68
6,157,221 A * 12/2000 Gorham et al. ......... 327/75

FOREIGN PATENT DOCUMENTS

JP 62269512 11/1987
JP 01091373 4/1989

* cited by examiner

*Primary Examiner*—Dinh T. Le
(74) *Attorney, Agent, or Firm*—Harness, Dickey & Pierce, P.L.C.

(57) ABSTRACT

A window voltage comparator, which determines whether a difference between two voltages is greater or smaller than a set value, is equipped with a first differential pair including a first transistor to which a first input voltage is applied and a second transistor to which a second input voltage is applied, a second differential pair including a third transistor to which a first reference voltage is applied and a fourth transistor to which a second reference voltage is applied, and a comparison circuit that compares the sum of drain currents of the first and fourth transistors with the sum of drain currents of the second and third transistors and thereby determines whether a difference between the first input voltage and the second input voltage is greater or smaller than a set value.

7 Claims, 2 Drawing Sheets

COMPARATOR CIRCUIT

Japanese Patent Application No. 2001-28648, filed Feb. 5, 2001, is hereby incorporated by reference in its entirety.

BACKGROUND OF THE INVENTION

The present invention relates to a comparator circuit that determines whether a difference between two voltages is greater or smaller than a set value (i.e., a window voltage comparator), and more particularly to a window voltage comparator that is suitable for circuit integration.

A general structure of a conventional window voltage comparator is shown in FIG. 3. The window voltage comparator includes a first instrumentation amplifier 31 that receives a first input voltage $V_A$ and a second input voltage $V_B$ and outputs a voltage in proportion to a difference thereof, a second instrumentation amplifier 32 that receives a first window voltage $V_{W1}$ and a second window voltage $V_{W2}$ and outputs a voltage in proportion to a difference thereof, and a comparator 33 that compares output voltages of the first instrumentation amplifier 31 and the second instrumentation amplifier 32 and generates an output $V_{OUT}$ corresponding to a result of the comparison.

The gain G of each of the instrumentation amplifiers 31 and 32 can be set, for example, at one time. However, it is difficult to realize the instrumentation amplifiers 31 and 32 in an IC, which performs an operation with an accurate gain in response to a wide range of input voltages. Also, the operation speed of a window voltage comparator is determined by a response speed of the instrumentation amplifiers 31 and 32. An ordinary instrumentation amplifier has a response frequency that is at most in the order of several kHz, and therefore is short of performance when an operation at frequencies on the order of MHz is desired.

It is noted that Japanese Patent Application Laid-open No. 62-269512 describes a high precision and high-speed voltage comparator that reduces influences of the offset voltage of a differential amplifier by using gate capacitance of MOS transistors and switches, without using a capacitance element that has no voltage dependency. However, this voltage comparator determines whether one input voltage is greater or smaller than one reference voltage, but it cannot make a determination based on four types of voltages as to whether a difference between two input voltages is greater or smaller than a set value that is determined by a difference between two reference voltages.

Also, Japanese Patent Application Laid-open No. 1-91373 describes a variable window comparator that adjusts the shifted position of a circuit part by a structure in which only the relative position of a window comparator with respect to the voltage axis can be shifted, while the upper and the lower reference voltages for the window comparator are maintained constant. However, this variable window comparator determines whether one input voltage is greater or smaller than two reference voltages, but it cannot make a determination based on four types of voltages as to whether a difference between two input voltages is greater or smaller than a set value that is determined by a difference between two reference voltages.

BRIEF SUMMARY OF THE INVENTION

In view of the above, the present invention may provide a circuit structure that achieves a high speed operation and is suitable for circuit integration in a window voltage comparator that determines whether a difference between two voltages is greater or smaller than a set value.

To solve the problems described above, a comparator circuit in accordance with a first aspect of the present invention comprises:

a first differential pair including a first transistor having a gate to which a first input voltage is applied and a second transistor having a gate to which a second input voltage is applied;

a second differential pair including a third transistor having a gate to which a first reference voltage is applied and a fourth transistor having a gate to which a second reference voltage is applied; and a comparison circuit that compares the sum of drain currents of at least the first and fourth transistors and the sum of drain currents of at least the second and third transistors and thereby determines whether a difference between the first input voltage and the second input voltage is greater or smaller than a difference between the first reference voltage and the second reference voltage.

Also, a comparator circuit in accordance with a second aspect of the present invention comprises:

a first N-channel transistor differential pair including a first N-channel transistor having a gate to which a first input voltage is applied and a second N-channel transistor having a gate to which a second input voltage is applied;

a first P-channel transistor differential pair including a first P-channel transistor having a gate to which the second input voltage is applied and a second P-channel transistor having a gate to which the first input voltage is applied;

a first current mixing circuit that obtains the sum of drain currents of the first N-channel transistor and the first P-channel transistor;

a second current mixing circuit that obtains the sum of drain currents of the second N-channel transistor and the second P-channel transistor;

a second N-channel transistor differential pair including a third N-channel transistor having a gate to which a first reference voltage is applied and a fourth N-channel transistor having a gate to which a second reference voltage is applied;

a second P-channel transistor differential pair including a third P-channel transistor having a gate to which the second reference voltage is applied and a fourth P-channel transistor having a gate to which the first reference voltage is applied;

a third current mixing circuit that obtains the sum of drain currents of the third N-channel transistor and the third P-channel transistor;

a fourth current mixing circuit that obtains the sum of drain currents of the fourth N-channel transistor and the fourth P-channel transistor; and a comparison circuit that compares the sum of output currents of the first and fourth current mixing circuits and the sum of output currents of the second and third current mixing circuits and thereby determines whether a difference between the first input voltage and the second input voltage is greater or smaller than a difference between the first reference voltage and the second reference voltage.

Here, the comparator circuit may further comprises a control circuit that controls a total gain of the first N-channel transistor differential pair and the first P-channel transistor differential pair by controlling a potential difference between a source potential of the first and second P-channel transistors and a source potential of the first and second N-channel transistors according to voltages of first and second input signals.

In the above, the comparison circuit may be formed of a folded-cascode amplifier circuit including two input transistors that receive a common gate potential and have sources connected to outputs of the all differential pairs.

By the structure described above, a difference of two input voltages is compared with a difference of two reference voltages, such that a determination can be made as to whether the difference of the two input voltages is greater or smaller than a set value. Also, since a transistor differential pair has a fast response speed, and is suitable for integration of circuits, a high speed window voltage comparator can be realized in a semiconductor integrated circuit.

DETAILED DESCRIPTION OF THE EMBODIMENT

Embodiments of the present invention are described below with reference to the accompanying drawings.

Figure 1:
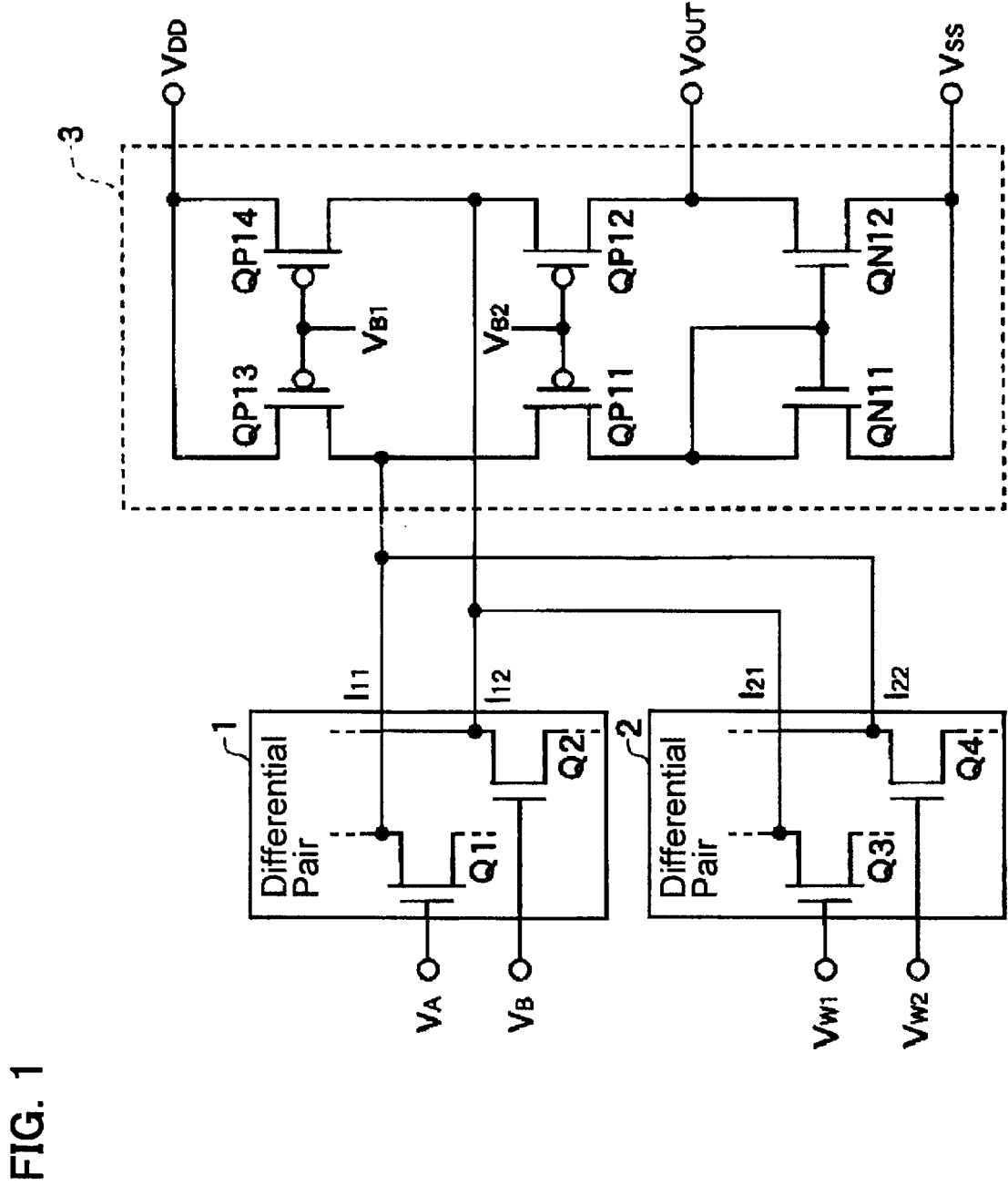
FIG. 1 shows a structure of a comparator circuit in accordance with one embodiment of the present invention.

FIG. 1 shows a structure of a comparator circuit in accordance with one embodiment of the present invention.

As shown in FIG. 1, the comparator circuit includes a transistor differential pair 1 that receives input voltages $V_A$ and $V_B$, a transistor differential pair 2 that receives reference voltages $V_{W1}$ and $V_{W2}$, and an amplifier circuit 3 that compares output currents of the differential pairs. In here, a difference between the reference voltages $V_{W1}$ and $V_{W2}$ represents a set value.

The differential pair 1 includes a first transistor Q1 that has a gate to which a first input voltage $V_A$ is applied and a second transistor Q2 that has a gate to which a second input voltage $V_B$ is applied. The first transistor Q1 outputs a current $I_{11}$, and the second transistor Q2 outputs a current $I_{12}$. Also, the differential pair 2 includes a third transistor Q3 that has a gate to which a reference voltage $V_{W1}$ is applied and a fourth transistor Q4 that has a gate to which a reference voltage $V_{W2}$ is applied. The third transistor Q3 outputs a current $I_{21}$, and the fourth transistor Q4 outputs a current $I_{22}$. The amplifier circuit 3 compares the sum $(I_{11}+I_{22})$ of the current $I_{11}$ and the current $I_{22}$ with the sum $(I^{12}+I_{21})$ of the current $I_{12}$ and the current $I_{21}$, thereby determines whether a difference between the input voltages $V_A$ and $V_B$ is greater or smaller than a difference between the reference voltages $V_{W1}$ and $V_{W2}$, and outputs a result thereof as an output voltage $V_{OUT}$.

While the first to fourth transistors Q1 to Q4 represent N-channel transistors in FIG. 1, they can represent P-channel transistors.

The amplifier circuit 3 is an amplifier circuit in a folded cascode connection. In the amplifier circuit 3, a bias voltage $V_{B1}$ is applied to gates of P-channel transistors QP13 and QP14, and these transistors QP13 and QP14 supply a specified drain current. P-channel transistors QP11 and QP12 are cascode-connected to the transistors QP13 and QP14, respectively. Also, a bias voltage $V_{B2}$ is applied to gates of the P-channel transistors QP11 and QP12. Further, a source of the transistor QP11 is connected to drains of the first transistor Q1 included in the differential pair 1 and the fourth transistor Q4 included in the differential pair 2. Also, a source of the transistor QP12 is connected to drains of the second transistor Q2 included in the differential pair 1 and the third transistor Q3 included in the differential pair 2.

The transistor QP11 amplifies the sum $(I_{11}+I_{22})$ of the output currents from the differential pairs 1 and 2, and outputs the amplified current from the drain. The transistor QP12 amplifies the sum $(I_{12}+I_{21})$ of the output currents from the differential pairs 1 and 2, and outputs the amplified current from the drain.

The transistors QP11 and QP12 amplify the sum of output currents of the differential pairs 1 and 2 and output the same from a drain thereof. N-channel transistors QN11 and QN12 that are respectively connected to the transistors QP11 and QP12 form a current mirror, such that a drain current of the transistor QN12 becomes to be equivalent to a drain current of the transistor QP11. As a result, an output of the transistor QP11 is folded and mixed with an output of the transistor QP12, such that an output voltage $V_{OUT}$, which corresponds to a difference between the current $(I_{11}+I_{22})$ and the current $(I_{12}+I_{21})$, is obtained at the drains of the transistors QP12 and QN12. This amplifier circuit is a current input type, and therefore has a characteristic in which voltage saturation is hard to occur.

Next, the circuit structure of the differential pairs that are used in the comparator circuit according to the present embodiment is described in detail.

Figure 2:
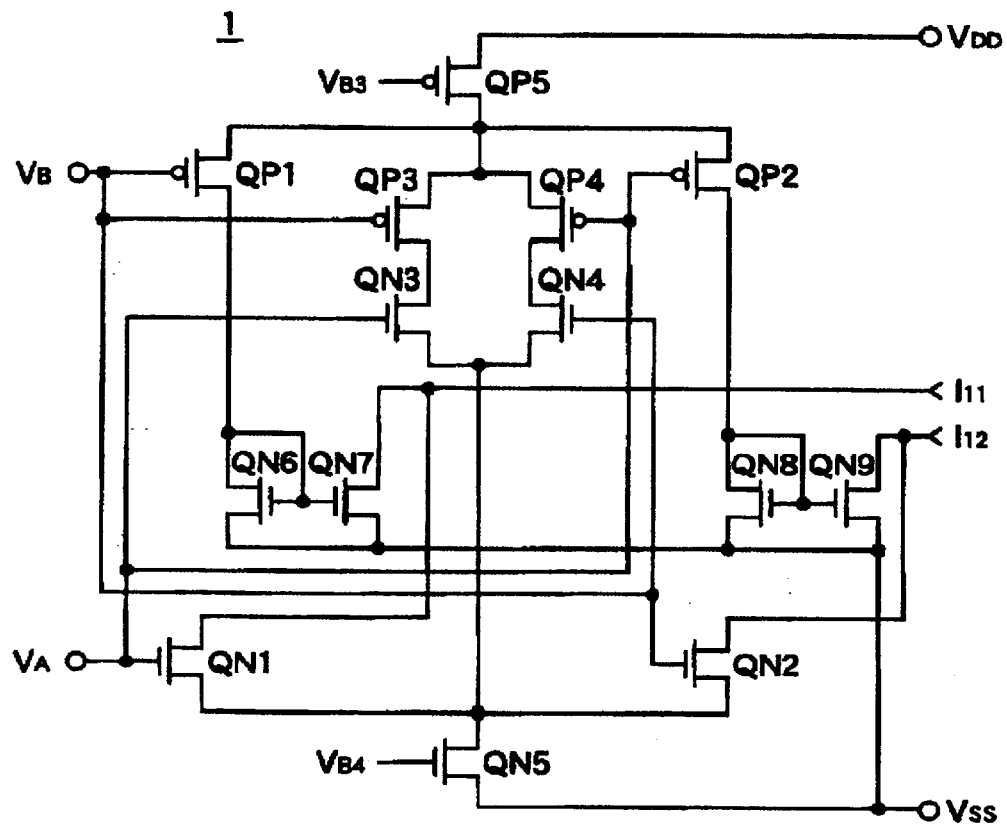
FIG. 2 shows a particular example of a circuit structure of a differential pair 1 shown in FIG. 1.
Figure 3:
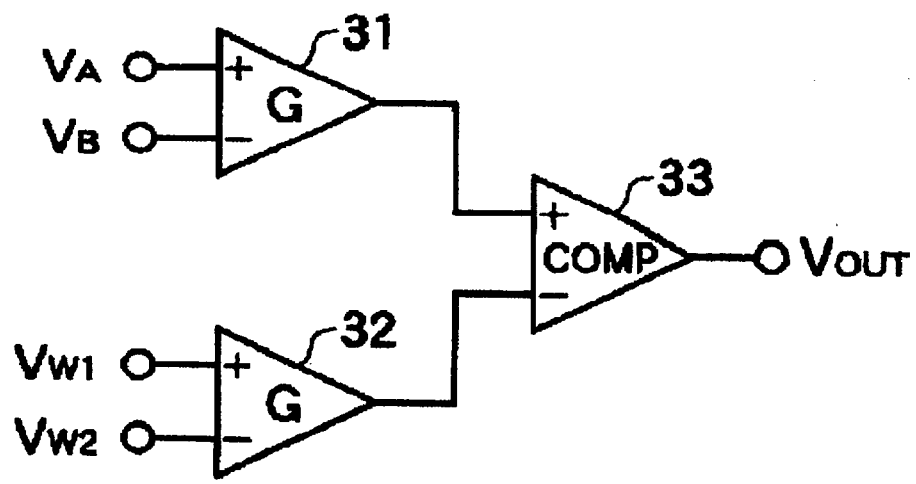
FIG. 3 shows a general structure of a conventional window voltage comparator.

FIG. 2 shows a particular example of a circuit structure of the differential pair 1 shown in FIG. 1. The same circuit structure can also be used for the differential pair 2.

As shown in FIG. 2, the differential pair 1 includes N-channel transistors QN1 and QN2 that form an N-channel transistor differential pair which operates when an input voltage is high, and P-channel transistors QP1 and QP2 that form a P-channel transistor differential pair that operates when an input voltage is low.

In the N-channel transistor differential pair that operates when an input voltage is high, an input voltage $V_A$ is applied to a gate of the transistor QN1, and an input voltage $V_B$ is applied to a gate of the transistor QN2. Sources of the transistors QN1 and QN2 are connected to an N-channel transistor QN5 that has a gate to which a bias voltage $V_{B4}$ is applied. A drain current of the transistor QN1 becomes a part of the output current $I_{11}$, and a drain current of the transistor QN2 becomes a part of the output current 112.

In the P-channel transistor differential pair that operates when an input voltage is low, the input voltage $V_B$ is applied to a gate of the transistor QP1, and the input voltage $V_A$ is applied to a gate of the transistor QP2. Sources of the transistors QP1 and QP2 are supplied with a current from a P-channel transistor QP5 that has a gate to which a bias voltage $V_{B3}$ is applied. A drain current of the transistor QP1 becomes a part of the output current $I_{11}$ by N-channel transistors QN6 and QN7 that form a current mirror. Also, a drain current of the transistor QP2 becomes a part of the output current $I_{12}$ by N-channel transistors QN8 and QN9 that form a current mirror.

It is noted that, when an input voltage is neither high nor low, both of the N-channel transistor differential pair and the P-channel transistor differential pair operate, and a total gain of the differential pairs increases. In order to prevent this, a circuit that is formed of the P-channel transistors QP3 and QP4 and the N-channel transistors QN3 and QN4 is provided, such that a potential difference between the source potential of the N-channel transistor differential pair and the source potential of the P-channel transistor differential pair is controlled to lower the total gain of the differential pairs. As a result, a differential amplification can be performed with a constant gain against a wide range of input voltages, and input voltages can be correctly converted to output currents.

As described above, in accordance with the present invention, a difference between two input voltages is compared with a difference between two reference voltages, such that a determination can be made as to whether the difference between the two input voltages is greater or smaller than a set value. Also, since a transistor differential pair has a fast response speed, and are suitable for circuit integration, a high-speed window voltage comparator can be realized in a semiconductor integrated circuit.

What is claimed is:

1. A comparator circuit comprising:
    a first differential pair including a first transistor having a gate to which a first input voltage is applied generating a first drain current, and a second transistor having a gate to which a second input voltage is applied generating a second drain current;
    a second differential pair including a third transistor having a gate to which a first reference voltage is applied generating a third drain current, and a fourth transistor having a gate to which a second reference voltage is applied generating a fourth drain current; and
    a comparison circuit connected to the first and second differential pairs, and receiving the first, second, third and fourth drains currents, the comparison circuit comparing the sum of at least the first and fourth drain current of the first and fourth transistors and the sum of at least the second and third drain currents of the second and third transistors and based on the comparison, thereby determining and outputting whether a difference between the first input voltage and the second input voltage is greater or smaller than a difference between the first reference voltage and the second reference voltage.

2. The comparator circuit as defined in claim 1, wherein the comparison circuit is formed of a folded-cascode amplifier circuit including two input transistors that have a common gate potential and have sources connected to the first and second differential pairs.

3. The comparator circuit as defined in claim 1, wherein the comparison circuit comprises:
    a first P-channel transistor having a source to which the sum of drain currents of at least the first and fourth transistor is supplied,
    a second P-channel transistor having a source to which the sum of drain currents of at least the second and third transistor is supplied and having a gate to which the same potential as the first P-channel transistor is supplied,
    a first N-channel transistor having a drain to which a drain of the first P-channel transistor is connected, and
    a second N-channel transistor having a drain to which a drain of the second P-channel transistor is connected,
    wherein the first and second N-channel transistors form a current mirror, and one of the drains of the first and second N-channel transistors is connected to the common gate of the first and second N-channel transistors, and the other drain of the first and second N-channel transistors becomes an output of the comparison circuit.

4. A comparator circuit comprising:
    a first N-channel transistor differential pair including a first N-channel transistor having a gate to which a first input voltage is applied and a second N-channel transistor having a gate to which a second input voltage is applied;
    a first P-channel transistor differential pair including a first P-channel transistor having a gate to which the second input voltage is applied and a second P-channel transistor having a gate to which the first input voltage is applied;
    a first current mixing circuit that obtains the sum of drain currents of the first N-channel transistor and the first P-channel transistor;
    a second current mixing circuit that obtains the sum of drain currents of the second N-channel transistor and the second P-channel transistor;
    a second N-channel transistor differential pair including a third N-channel transistor having a gate to which a first reference voltage is applied and a fourth N-channel transistor having a gate to which a second reference voltage is applied;
    a second P-channel transistor differential pair including a third P-channel transistor having a gate to which the second reference voltage is applied and a fourth P-channel transistor having a gate to which the first reference voltage is applied;
    a third current mixing circuit that obtains the sum of drain currents of the third N-channel transistor and the third P-channel transistor;
    a fourth current mixing circuit that obtains the sum of drain currents of the fourth N-channel transistor and the fourth P-channel transistor; and
    a comparison circuit that compares the sum of output currents of the first and fourth current mixing circuits and the sum of output currents of the second and third current mixing circuits and thereby determines whether a difference between the first input voltage and the second input voltage is greater or smaller than a difference between the first reference voltage and the second reference voltage.

5. The comparator circuit as defined in claim 4, further comprising:
    a control circuit that controls a total gain of the first N-channel transistor differential pair and the first P-channel transistor differential pair by controlling a potential difference between a source potential of the first and second P-channel transistors and a source potential of the first and second N-channel transistors according to voltages of first and second input signals.

6. The comparator circuit as defined in claim 4, wherein the comparison circuit is formed of a folded-cascode amplifier circuit including two input transistors that receive a common gate potential and have sources connected to outputs of the first and second N-channel transistor differential pairs and the first and second P-channel transistor differential pairs.

7. The comparator circuit as defined in claim 4, wherein the comparison circuit comprises:
    a fifth P-channel transistor having a source to which the sum of output currents of the first and fourth current mixing circuit is supplied, a sixth P-channel transistor having a source to which the sum of output currents of the second and third current mixing circuit is supplied and having a gate to which the same potential as the fifth P-channel transistor is supplied, a fifth N-channel transistor having a drain to which a drain of the fifth P-channel transistor is connected, and a sixth N-channel transistor having a drain to which a drain of the sixth P-channel transistor is connected, wherein the fifth and sixth N-channel transistors form a current mirror, and one of the drains of the fifth and sixth N-channel transistors is connected to the common gate of the fifth and sixth N-channel transistors, and the other drain of the drains of the fifth and sixth N-channel transistors becomes an output of the comparison circuit.

\* \* \* \* \*